United States Patent [19]

Yung

[11] Patent Number: 5,623,202

[45] Date of Patent: Apr. 22, 1997

[54] TESTING MULTIPLE IC IN PARALLEL BY A SINGLE IC TESTER

[75] Inventor: C. Y. Yung, Hsin-Chu, Taiwan

[73] Assignee: United Microelectronics Corporation, Hsinchu, Taiwan

[21] Appl. No.: 311,809

[22] Filed: Sep. 26, 1994

[51] Int. Cl.⁶ .................................................. G01R 1/04
[52] U.S. Cl. ......................................... 324/158.1; 324/754
[58] Field of Search ................................. 324/158.1, 754

[56] References Cited

U.S. PATENT DOCUMENTS

| | | | |
|---|---|---|---|
| 4,459,693 | 7/1984 | Prang et al. | 324/73.1 |
| 5,208,529 | 5/1993 | Tsurishima et al. | 324/72.5 |
| 5,396,185 | 3/1995 | Honma et al. | 324/754 |
| 5,404,099 | 4/1995 | Sahara | 324/158.1 |

*Primary Examiner*—Kenneth A. Wieder
*Assistant Examiner*—Barry C. Bowser
*Attorney, Agent, or Firm*—Barnes, Kisselle, Raisch, Choate, Whittemore & Hulbert, P.C.

[57] ABSTRACT

A single IC testing machine can be used to test several IC chips connected in parallel by a unique hardware design and a special software program for execution, for instance, a single testing head and a single set of address input lines can be used for testing the chips by connecting the corresponding similar address input pins of the chips together first and then connecting to the address input lines of the testing machine, and connecting the data I/O pins of the chips to the data I/O pins of the testing machine, and then connecting the voltage input and the ground of the chips to separate voltage sources.

9 Claims, 2 Drawing Sheets

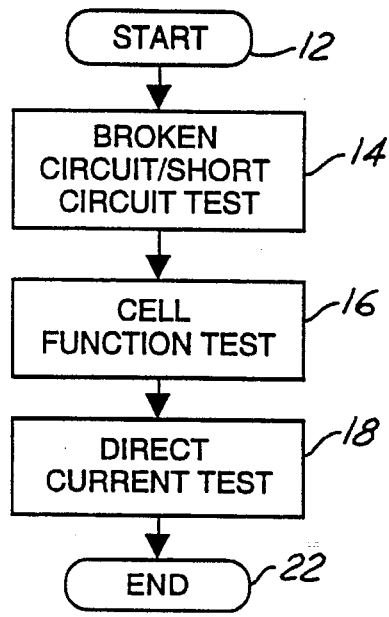
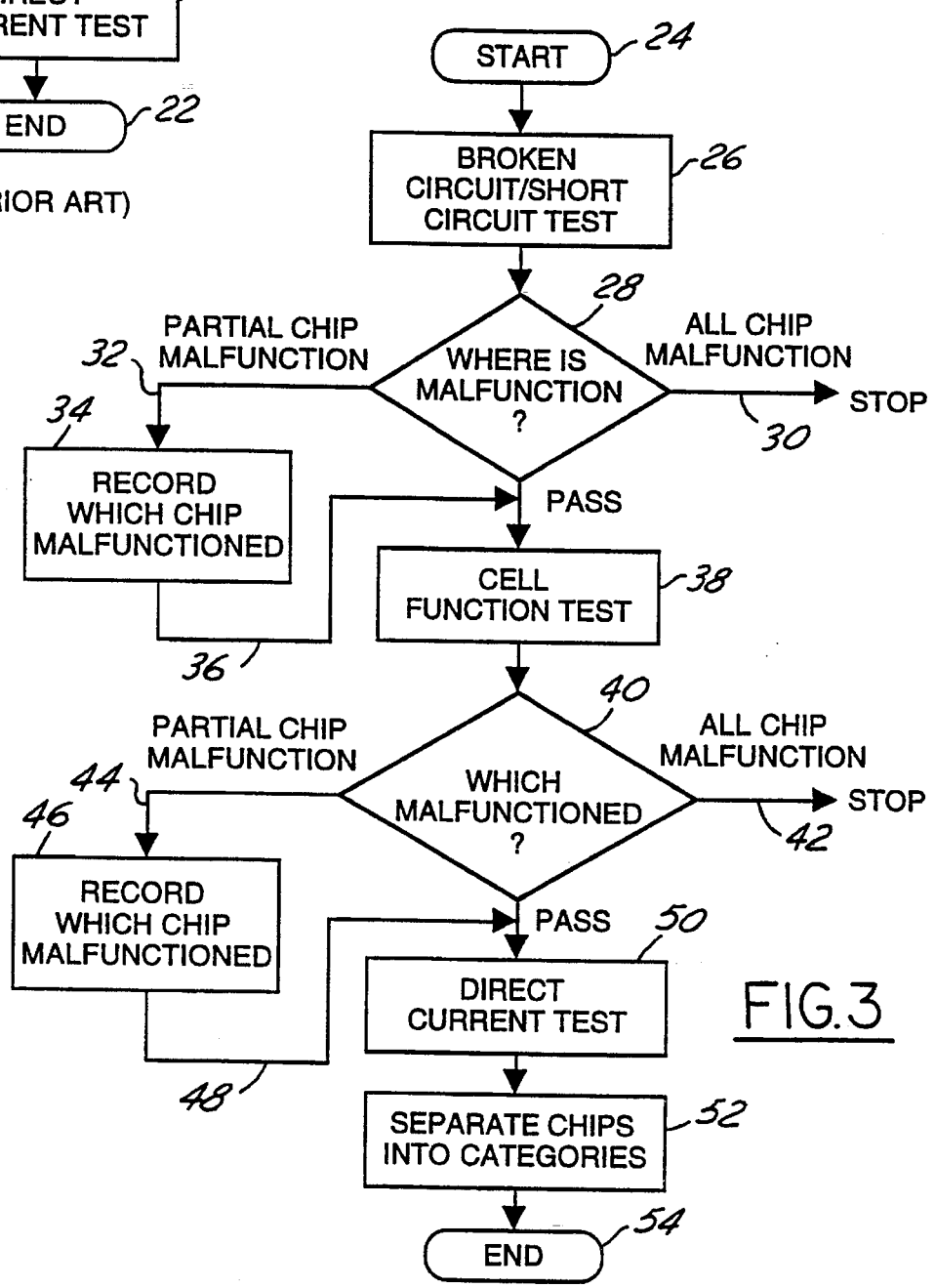

TESTING MULTIPLE IC IN PARALLEL BY A SINGLE IC TESTER

FIELD OF THE INVENTION

The present invention generally relates to a method of testing IC chips by a single IC tester and more particularly, relates to a method of testing multiple IC chips in parallel by a single IC tester as a time saving and money saving method.

BACKGROUND OF THE INVENTION

In the manufacturing of integrated circuit (IC) chips, a quality control procedure is an important step to insure that the circuits will perform as designed. The quality control procedure involves various steps of testing the major functions of the chip. For instance, tests frequently involved are the short circuit/broken circuit test, a cell function test, and a direct current test. These tests are normally conducted on sophisticated and expensive test equipment and are very time consuming. However, due to the importance of the quality control procedure, they must be performed as part of the IC manufacturing process.

Presently, two test methods are commonly used in the IC manufacturing industry. The first method tests one IC chip on a single test machine at a time. If is therefore a very time consuming process. The second commonly used test method is a parallel testing method which uses a multiple set of address input lines. This method requires the installation of a multiple set of address input lines and therefore requires additional equipment expenditures.

It is therefore an object of the present invention to provide a test method for integrated circuit chips that does not have the shortcomings of the prior art test methods.

It is another object of the present invention to provide a method of testing integrated circuit chips that does not require the installation of a multiple set of address input lines.

It is a further object of the present invention to provide a method of testing integrated circuit chips that is capable of testing multiple IC chips in parallel by a single testing machine.

It is yet another object of the present invention to provide a method of testing integrated circuit chips by first connecting all of the corresponding address input pins of the chips together and then to the address input lines of the testing machine, connecting all the data I/O pins to the data I/O pins of the testing machine, and connecting the voltage input and ground of the chips to separate voltage sources.

SUMMARY OF THE INVENTION

In accordance with the present invention, a method of testing multiple IC chips in parallel by a single IC testing machine is provided.

In the preferred embodiment, a single IC testing machine can be used to test several IC chips connected in parallel by a unique hardware design and a special software program for execution. The preferred embodiment uses a single testing head and a single set of address input lines for testing the chips by connecting the corresponding similar address input pins of the chips together first and then connecting to the address input lines of the testing machine, and connecting the data I/O pins of the chips to the data I/O pins of the testing machine, and then connecting the voltage input and the ground of the chips to separate voltage sources.

BRIEF DESCRIPTION OF THE DRAWINGS

Other objects, features and advantages of the present invention will become apparent upon consideration of the specification and the appended drawings, in which:

FIG. 2 is a block diagram showing the software program for a prior art test method.

FIG. 3 is a block diagram showing the software program for the present invention test method.

DETAILED DESCRIPTION OF THE PREFERRED EMBODIMENT

Figure 1:
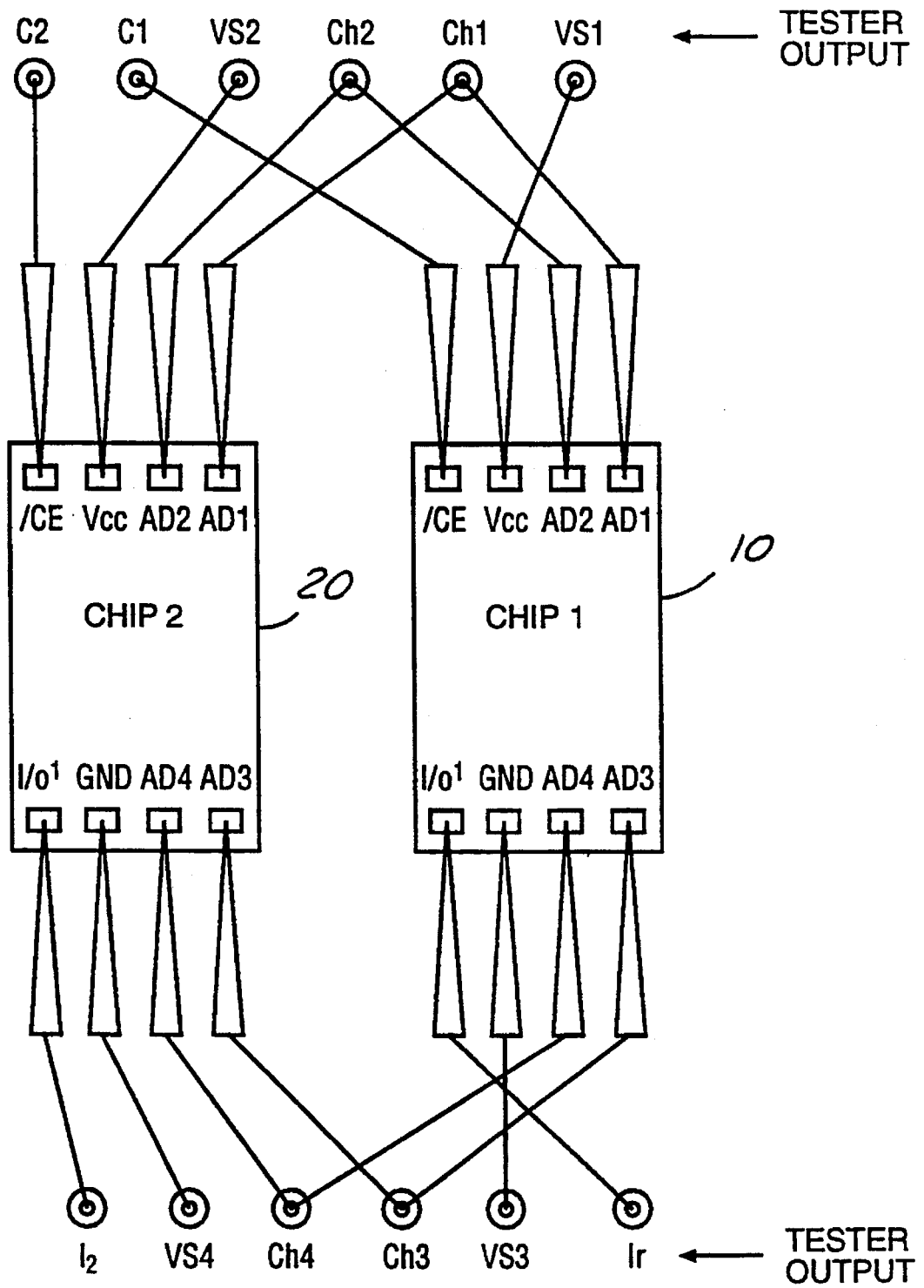
FIG. 1 is a wiring diagram showing the present invention with two IC chips.

The present invention enables the use of a single testing head, and a single set of address input lines to test multiple numbers of IC chips. It can be executed by first connecting all the corresponding address input pins of several IC chips together and then connecting them to the address input lines of the testing head, connecting the corresponding data I/O pins to the data I/O pins on the testing head, and then connecting the voltage input and the ground to separate voltage sources. The present invention method is different than the prior art method which requires that the ground of the IC chips be connected to the ground of the testing machine. It provides a distinct advantage of saving test time and therefore increasing the efficiency of the test machines. It further provides the benefit of saving the cost necessary for installing additional test machines.

Referring initially to FIG. 1, a wiring diagram of the hardware for the present invention is shown therein. It is shown that two IC chips 10 and 20 are connected in parallel to a single test machine. The address signal input pins AD1, AD2, AD3, and AD4 of the chip 10 and 20 are connected to corresponding signal point CH1, CH2, CH3, and CH4 of the test machine. This is different than the method used in the prior art in which AD1, AD2, AD3, and AD4 of chip 10 and chip 20 are each connected to different signal point of the test machine. As shown in FIG. 1, AD1 of chip 10 and AD1 of chip 20 are both connected to CH1 of the test machine, AD2 of chip 10 and AD2 of chip 20 are both connected to CH2 of the test machine, AD3 of chip 10 and AD3 of chip 20 are both connected to CH3 of the test machine, and AD4 of chip 10 and AD4 of chip 20 are both connected to CH4 of the test machine.

In the next step of connecting the chips to the test machine, the voltage input terminals (VCC) and the ground terminals of chip 10 and chip 20 are connected respectively to different voltage output points VS1, VS2, VS3, and VS4 of the test machine. This is again contrary to a prior art method in which the ground terminals of chip 10 and chip 20 are connected to the ground terminals of the test machine. As shown in FIG. 1, the VCC terminal of chip 10 is connected to VS1, the VCC terminal of chip 20 is connected to VS2, the ground terminal of chip 10 is connected to VS3, and the ground terminal of chip 20 is connected to VS4.

The data I/O terminals I/O 1 of chip 10 and chip 20 are connected respectively to the data I/O terminals $I_1$ and $I_2$ of the test machine. Finally, the control signal terminal /CE of chip 10 and chip 20 (or /DE, /WE which are not shown in FIG. 1) are connected to the signal control terminals C1 and C2 of the test machine.

A flow chart of a prior art test method is shown in FIG. 2. The software for testing an IC chip is shown with block 12 as the start of the test, block 14 as the first test for broken circuit/short circuit, block 16 for a cell function test, block 18 for direct current test, and block 22 as the end of the test. In this prior art test method, either only a single IC chip is tested at a time or a multiple set of address input lines is required for testing of several chips in parallel.

FIG. 3 shows a flow chart of the software for the present invention test method. At the end of each test step, a determination is made as to which IC chips have a malfunction. The chips with the malfunction are then recorded and separated such that further testing on such chips is discontinued, the testing then continues for the other remaining chips.

As shown in FIG. 3, block 24 indicates the start of a test procedure. In the first test of broken circuit/short circuit as indicated by block 26, the prior art method requires that each pin on each IC chip be tested. The present invention, instead, requires the connection of the same address input pins on different chips together. It is therefore not possible to test each pin individually. The present invention therefore tests the control signal pin and the data I/O pins of each IC chip. The present invention method does not test the address input pins.

After test block 26, block 28 determines which chips are not working properly and therefore chooses one of three alternatives. When all chips have malfunctioned, as indicated by route 30, the computer program stops the complete testing procedure. When only part of the chips has malfunctions as indicated by route 32, block 34 records which ones are malfunctioned, and then return to the main test route through route 36. When test result from block 28 is that all chips are perfect, block 38 in which the cell functions are tested is executed.

When the present invention test method executes a cell function test, it treats a multiple number of IC chips as a single chip for the purpose of testing. For instance, for two chips each having 15 address input pins and 8 data I/O pins, the present invention parallel testing method treats the two chips as a single chip of 15 address input pins and 16 data I/O pins for the purpose of testing. The first 8 data I/O pins are from the first chip, while the second 8 data I/O pins are from the second chip. When a malfunction is detected, it is determined whether the first 8 data I/O pins or the second 8 data I/O pins have malfunctioned in order to determine which one of the chips has malfunctioned.

As shown in FIG. 3, after the cell function test block 38, a determination is made in block 40 on which chips are malfunctioned. In the case that all chips have malfunctioned, route 42 will be taken to stop the test procedure completely. When some of the chips are malfunctioned, route 44 will be taken to reach block 46 in which the malfunctioned chips are recorded and then sent through route 48 to the next test. In the next test block 50, a direct current test is conducted.

In the direct current test, the conventional method is to add a positive voltage to the voltage source of the chip and the ground pin, and then measure the current from the voltage source. The present invention method of measuring direct current is dependent on whether the substrate for the chip is of the N type or the P type. For the N type substrate, a positive voltage is added to the voltage source of the chip and 0 V is added to the ground, the current is then measured from the ground pin. In a case of a P type substrate, a positive voltage is added to the voltage source of the chip and a 0 V is added to the ground, and then the current is measured from the voltage source. As shown in FIG. 3, the direct current testing is indicated by block 50. After the direct current testing, the chips are separated into different categories in block 52 and the test ends in block 54.

The present invention of testing a multiple IC chips in parallel by a single IC tester provides the benefits of saving testing time, increasing the efficiency of testing machines, and further saves the cost of installing more testing machines. An example of such a testing machine is XIN-CON 5588 for testing performance of boards.

I claim:

1. A method of testing multiple IC chips by a single IC testing machine, comprising the steps of:

providing at least two active removable integrated circuit chips on a single IC testing machine, connecting the same address input pins of said at least two active removeable IC chips in parallel into a first connection, connecting thereafter said first connection with an address input line of a testing machine, connecting data I/O pins of said at least two active removeable IC chips with data I/O pins of said testing machine, connecting thereafter a voltage input terminal and a ground terminal of said at least two active removeable IC chips to separate voltage sources, performing thereafter at least two tests on each of said at least two active removeable integrated circuit chips selected from the group consisting of a broken circuit/ short circuit test, a cell function test, and a direct current test, transferring from one test to another test of said at least two tests being performed if at least one of said multiple IC chips has passed said one of said at least two tests, and removing said at least two active removable integrated circuit chips from said single IC testing machine.

2. A method of testing IC chips according to claim 1, wherein said method further comprises the step of using one set of address input lines for testing a multiple number of IC chips.

3. A method of testing IC chips according to claim 1, wherein said broken circuit/short circuit test comprising testing the control signal pins and the data I/O pins of each IC chip.

4. A method of testing IC chips according to claim 1, wherein said cell function test when executed in parallel is capable of testing two IC chips as a single IC chip by combining data I/O pins of both chips.

5. A method of testing IC chips according to claim 1, wherein said direct current testing being different for P type substrate and N type substrate.

6. A method of testing IC chips according to claim 5, wherein when said substrate is an N type, a positive voltage is added to the voltage source of said chip and a 0 V is added to the ground, while the current is measured from said ground.

7. A method of testing IC chips according to claim 5, wherein when said substrate is a P type, a positive voltage is added to the voltage source of said chip and a 0 V is added to the ground, while the current is measured from said voltage source.

8. A method of testing multiple IC testing machine, comprising the steps of:

providing at least two active removeable integrated circuit chips, connecting the same address input pins of said at least two active IC chips in parallel into a first connection, connecting thereafter said first connection with an address input line of a testing machine, connecting data I/O pins of said at least two active removeable IC chips with data I/O pins of said testing machine, connecting thereafter a voltage input terminal and a ground terminal of said at least two active removeable IC chips to separate voltage sources, performing thereafter at least one test on each of said at least two removable integrated circuit chips selected from the group consisting of a broken circuit/short circuit test, a cell function test, and a direct current test, and removing said at least two active removable integrated circuit chips from said single IC testing machine.

9. A method of testing multiple IC chips by a single IC testing machine, comprising the steps of:

providing at least two removable integrated circuit chips on a single IC testing machine, connecting the same address input pins of said at least two removeable IC chips in parallel into a first connection, connecting thereafter said first connection with an address input line of a testing machine, connecting data I/O pins of said at least two IC chips with data I/O pins of said testing machine, connecting thereafter a voltage input terminal and a ground terminal of said at least two IC chips to separate voltage sources, performing thereafter at least two tests on each of said at least two removable integrated circuit chips selected from the group consisting of a broken circuit/short circuit test, a cell function test, and a direct current test, transferring from one test to another test of said at least two tests being performed if at least one of said IC chips has passed said one of said at least two tests, and removing said at least two removable integrated circuit chips from said single IC testing machine.

* * * * *